(12) United States Patent
Nishioka et al.

(10) Patent No.: US 6,898,851 B2
(45) Date of Patent: May 31, 2005

(54) ELECTRONIC DEVICE MANUFACTURING METHOD

(75) Inventors: Yasutaka Nishioka, Tokyo (JP); Junjiro Sakai, Tokyo (JP); Shingo Tomohisa, Tokyo (JP); Susumu Matsumoto, Osaka (JP); Fumio Iwamoto, Kyoto (JP); Michinari Yamanaka, Osaka (JP)

(73) Assignees: Renesas Technology Corp., Tokyo (JP); Matsushita Electric Industrial Co., Ltd., Kadoma (JP)

( * ) Notice: Subject to any disclaimer, the term of this patent is extended or adjusted under 35 U.S.C. 154(b) by 47 days.

(21) Appl. No.: 10/717,718

(22) Filed: Nov. 21, 2003

(65) Prior Publication Data

US 2004/0163246 A1 Aug. 26, 2004

(30) Foreign Application Priority Data

Feb. 21, 2003 (JP) .......... 2003-043662

(51) Int. Cl.$^7$ ............... H01K 3/10
(52) U.S. Cl. .......... 29/852; 29/825; 29/830; 29/832; 29/840; 29/846; 438/623; 438/634; 438/637; 438/638; 438/687
(58) Field of Search ............ 29/825, 830, 832, 29/840, 846; 438/623, 634, 637, 638, 687

(56) References Cited

U.S. PATENT DOCUMENTS

| | | | |
|---|---|---|---|
| 6,291,891 B1 * | 9/2001 | Higashi et al. ............ | 257/774 |
| 6,368,951 B2 * | 4/2002 | Higashi et al. ............ | 438/618 |
| 6,383,907 B1 * | 5/2002 | Hasegawa et al. ........ | 438/597 |
| 6,440,844 B1 * | 8/2002 | Takagi et al. ............ | 438/637 |
| 6,509,273 B1 * | 1/2003 | Imai et al. ................ | 438/693 |
| 6,566,283 B1 * | 5/2003 | Pangrle et al. ............ | 438/788 |
| 6,624,061 B2 * | 9/2003 | Aoki ....................... | 438/622 |
| 6,723,631 B2 * | 4/2004 | Noguchi et al. .......... | 438/618 |
| 6,743,713 B2 * | 6/2004 | Mukherjee-Roy et al. .. | 438/638 |
| 6,765,283 B2 * | 7/2004 | Umemoto ................. | 257/637 |
| 6,787,446 B2 * | 9/2004 | Enomoto et al. ......... | 438/623 |

FOREIGN PATENT DOCUMENTS

JP 2000-269326 9/2000

OTHER PUBLICATIONS

S. M. Jang, et al., "Integration of CU and Low–K Material for Dual–Damascene Process", Semiconductor Technology, (ISTC 2001), vol. 1, pp. 485–493.

(Continued)

*Primary Examiner*—Carl J. Arbes
(74) *Attorney, Agent, or Firm*—Oblon, Spivak, McClelland, Maier & Neustadt, P.C.

(57) ABSTRACT

It is an object to provide a semiconductor device having a buried multilayer wiring structure in which generation of a resolution defect of a resist pattern is suppressed and generation of a defective wiring caused by the resolution defect is reduced. After a via hole (7) reaching an etching stopper film (4) is formed, annealing is carried out at 300 to 400° C. with the via hole (7) opened. As an annealing method, it is possible to use both a method using a hot plate and a method using a heat treating furnace. In order to suppress an influence on a lower wiring (20) which has been manufactured, heating is carried out for a short time of approximately 5 to 10 minutes by using the hot plate. Consequently, a by-product staying in an interface of an upper protective film (6) and an interlayer dielectric film (5) having a low dielectric constant and a by-product staying in an interface of the etching stopper film (4) and the interlayer dielectric film (5) having a low dielectric constant are discharged so that an amount of the residual by-product can be decreased.

20 Claims, 16 Drawing Sheets

OTHER PUBLICATIONS

K. Higashi, et al., "A Manufacturable Copper/Low–K SiOC/ SiCN Process Technology for 90NM–Node High Performance eDRAM", Proceedings of the 2002 International Interconnect Technology Conference, pp. 15–17.

M. Fayolle, et al., "Integration of Cu/SiOC in Dual Damascene Interconnect for 0.1$\mu$m Technology Using A New SiC Material as Dielectric Barrier", Proceedings of the 2002 International Interconnect Technology Conference, pp. 39–41.

* cited by examiner

F I G . 1 1
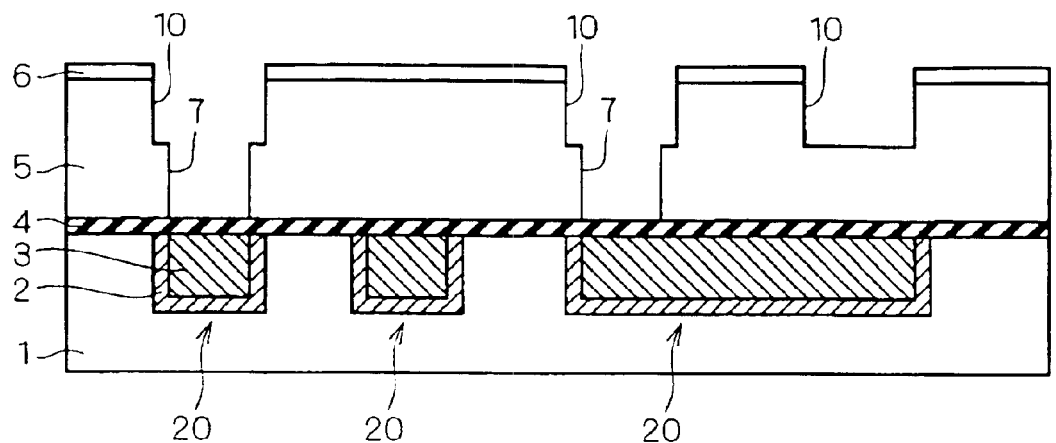
F I G . 1 2
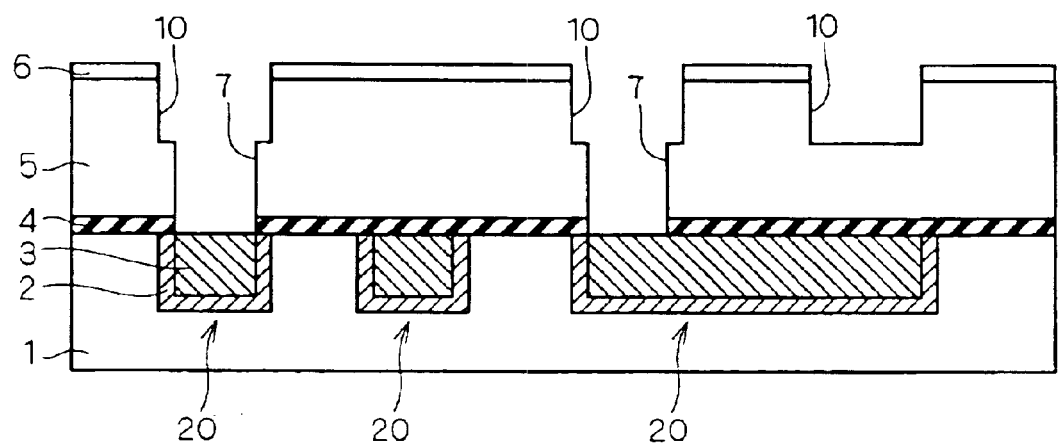

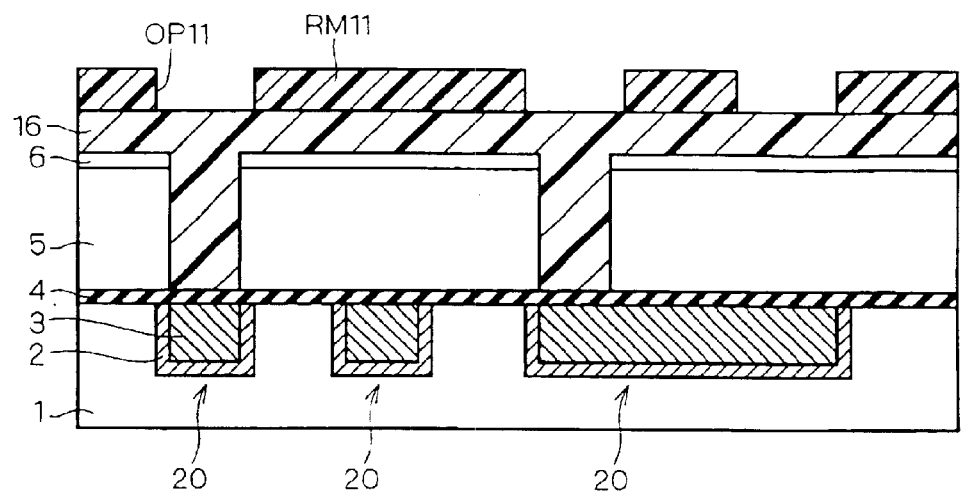
F I G . 1 7
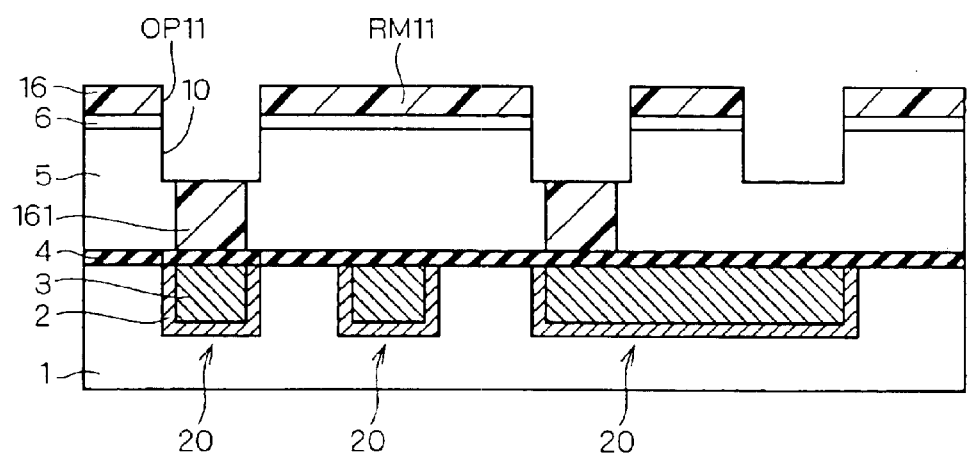
F I G . 1 8

F I G. 1 9
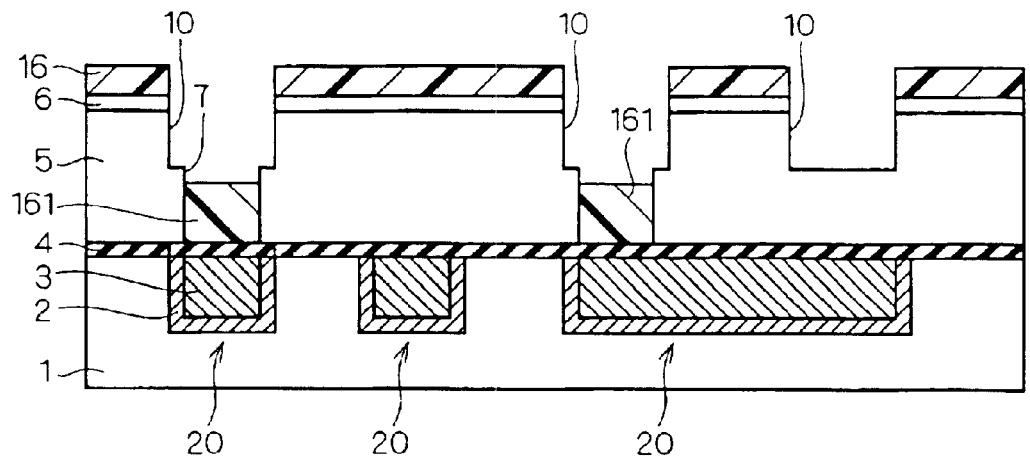
F I G. 2 0
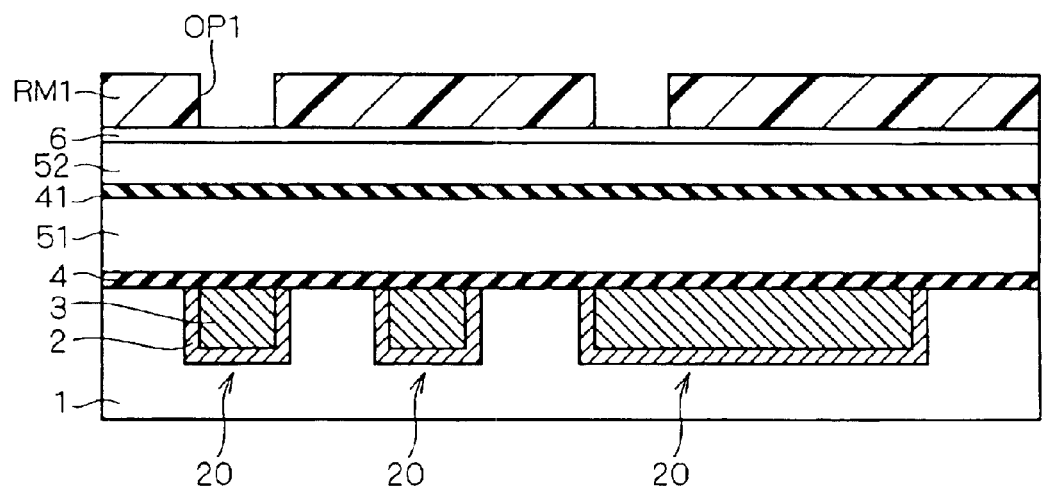

F I G. 3 1
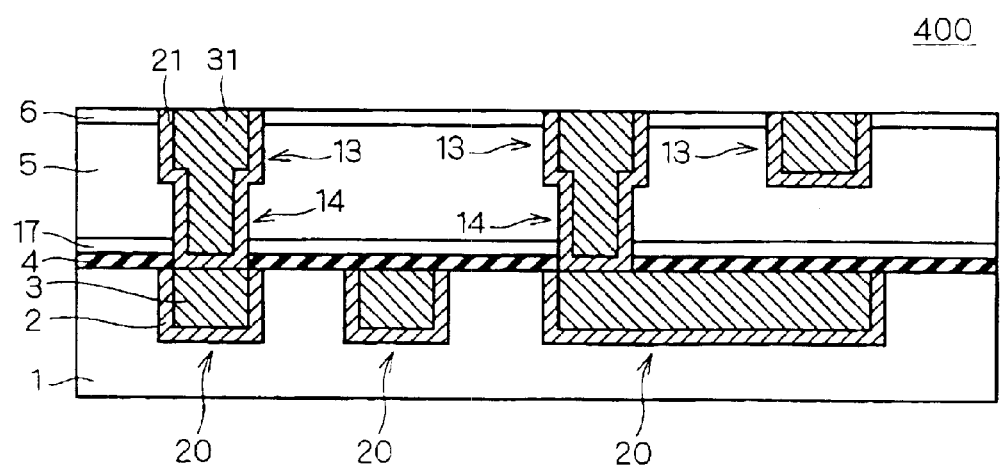

ELECTRONIC DEVICE MANUFACTURING METHOD

BACKGROUND OF THE INVENTION

1. Field of the Invention

The present invention relates to a method of manufacturing an electronic device and more particularly to a method of manufacturing an electronic device having a buried multilayer wiring structure.

2. Description of the Background Art

In a method of manufacturing a semiconductor device having a buried multilayer wiring structure, recently, there has been employed a technique referred to as a dual-damascene method in order to electrically connect a structure of lower layers provided by interposing an interlayer dielectric film therebetween to an upper wiring. In this technique, a plug reaching the structure of the lower layers through the interlayer dielectric film and the upper wiring are formed at the same time. An example of this method has been disclosed in Japanese Patent Application Laid-Open No. 2000-269326 (Column 4, FIGS. 1 to 8) (which will be hereinafter referred to as Patent Document).

More specifically, the Patent Document has disclosed an example in which a resist material is buried in a contact hole reaching a semiconductor substrate through an interlayer dielectric film and ultraviolet rays are irradiated on the resist material to be cured, and a wiring trench for forming an upper wiring is provided in a surface of the interlayer dielectric film by etching.

In a recent method of manufacturing a semiconductor device, a KrF excimer laser having a wavelength of 248 nm and an ArF excimer laser having a wavelength of 193 nm are used for an exposing light source in order to form a fine resist pattern having a line width of 0.3 $\mu$m or less and a chemically amplified resist utilizing a catalytic reaction is used for a resist material to be a sensitizer in many cases.

The chemically amplified resist has a mechanism for generating a hydrogen ion by sensitization and using the hydrogen ion as a catalyst to thermally react a resist resin, thereby resolving a pattern. In the case in which the chemically amplified resist is used, there is a possibility that a so-called resist poisoning phenomenon might present itself, because of a neutralization of a hydrogen ion, that is, a wiring pattern connected to an outermost hole of a hole pattern, particularly, an isolated hole pattern or a densely disposed hole pattern might not be resolved normally.

SUMMARY OF THE INVENTION

It is an object of the present invention to provide an electronic device having a buried multilayer wiring structure in which a resolution defect of a resist pattern can be prevented from being generated and generation of a defective wiring caused by the resolution defect can be reduced.

A first aspect of the present invention is directed to a method of manufacturing an electronic device including an underlying layer, an etching stopper film of an insulator provided on the underlying layer, an interlayer dielectric film provided on the etching stopper film, a lower wiring buried in an upper main surface of the underlying layer, an upper wiring buried in an upper main surface of the interlayer dielectric film, and a contact section for electrically connecting the lower wiring to the upper wiring, the method including the following steps (a) to (g). More specifically, at the step (a), the interlayer dielectric film is selectively removed and a hole penetrating through the interlayer dielectric film to reach the etching stopper film is formed. At the step (b), a heat treatment is carried out with the hole opened. At the step (c), the hole is filled with an organic resin which can be cured by a deep ultraviolet light and the organic resin is cured with the deep ultraviolet light to form a buried plug. At the step (d), the interlayer dielectric film and the buried plug are selectively removed by using a chemically amplified resist as an etching mask and a trench pattern for burying the upper wiring is formed in the upper main surface of the interlayer dielectric film. At the step (e), the buried plug remaining in the hole is removed to obtain a structure in which the trench pattern communicates with the hole. At the step (f), the etching stopper film is selectively removed to expose the lower wiring. At the step (g), the trench pattern and the hole are filled with a conductor material to simultaneously form the upper wiring and the contact section.

In the method of manufacturing an electronic device, the heat treatment is carried out after the hole penetrating through the interlayer dielectric film is formed. Therefore, a by-product present in an interface of the etching stopper film of the insulator and the interlayer dielectric film is discharged so that an amount of the residual by-product can be decreased. Consequently, the chemically amplified resist to be used for forming the trench pattern to bury the upper wiring can be prevented from being deactivated by the by-product and a resist poisoning phenomenon causing a resolution defect of a resist pattern can be prevented from being generated. As a result, it is possible to obtain a semiconductor device having a buried multilayer wiring structure in which generation of the resolution defect of the resist pattern is suppressed and generation of a defective wiring caused by the resolution defect is reduced. At this time, moreover, water adsorbed into a deteriorated layer formed on an internal wall of the hole can also be discharged and a surface condition of the deteriorated layer can also be reformed. Consequently, it is also possible to prevent the resist poisoning phenomenon from being accelerated by presence of the deteriorated layer. Furthermore, the buried plug is provided in the hole. In the case in which an anti-reflection coating agent is to be formed on the interlayer dielectric film, for example, it is not necessary to fill the hole with limited kinds of anti-reflection coating agents and an organic resin having a large material selection can be used. Therefore, a convenience can be enhanced and a structure of the electronic device can also have a larger selection. Furthermore, it is not necessary to fill the hole with the anti-reflection coating agent. Consequently, it is possible to reduce a variation in a thickness of the anti-reflection coating depending on a hole density.

A second aspect of the present invention is directed to a method of manufacturing an electronic device including an underlying layer, an etching stopper film of an insulator provided on the underlying layer, an interlayer dielectric film provided on the etching stopper film, a lower wiring buried in an upper main surface of the underlying layer, an upper wiring buried in an upper main surface of the interlayer dielectric film, and a contact section for electrically connecting the lower wiring to the upper wiring, the method including the following steps (a) to (g). More specifically, at the step (a), the interlayer dielectric film is selectively removed and a hole penetrating through the interlayer dielectric film to reach the etching stopper film is formed. At the step (b), a heat treatment is carried out with the hole opened. At the step (c), the hole is filled with an SOG material and a heat treatment is carried out at 50 to 200° C.

to crosslink the SOG material, thereby forming a buried plug in the hole. At the step (d), the interlayer dielectric film and the buried plug are selectively removed by using a chemically amplified resist as an etching mask and a trench pattern for burying the upper wiring is formed in the upper main surface of the interlayer dielectric film. At the step (e), the buried plug remaining in the hole is removed to obtain a structure in which the trench pattern communicates with the hole. At the step (f), the etching stopper film is selectively removed to expose the lower wiring. At the step (g), the trench pattern and the hole are filled with a conductor material to simultaneously form the upper wiring and the contact section.

In the method of manufacturing an electronic device, the heat treatment is carried out after the hole penetrating through the interlayer dielectric film is formed. Therefore, a by-product present in an interface of the etching stopper film of the insulator and the interlayer dielectric film is discharged so that an amount of the residual by-product can be decreased. Consequently, the chemically amplified resist to be used for forming the trench pattern to bury the upper wiring can be prevented from being deactivated by the by-product and a resist poisoning phenomenon causing a resolution defect of a resist pattern can be prevented from being generated. As a result, it is possible to obtain a semiconductor device having a buried multilayer wiring structure in which generation of the resolution defect of the resist pattern is suppressed and generation of a defective wiring caused by the resolution defect is reduced. At this time, moreover, water adsorbed into a deteriorated layer formed on an internal wall of the hole can also be discharged and a surface condition of the deteriorated layer can also be reformed. Consequently, it is also possible to prevent the resist poisoning phenomenon from being accelerated by presence of the deteriorated layer. Furthermore, the buried plug is provided in the hole. In the case in which an anti-reflection coating agent is to be formed on the interlayer dielectric film, for example, it is not necessary to fill the hole with limited kinds of anti-reflection coating agents and an SOG material having a large material selection can be used. Therefore, a convenience can be enhanced and a structure of the electronic device can also have a larger selection. Furthermore, it is not necessary to fill the hole with the anti-reflection coating agent. Consequently, it is possible to reduce a variation in a thickness of the anti-reflection coating depending on a hole density. Moreover, the buried plug constituted by the SOG material is hydrophobic, and furthermore, has such a characteristic that diffusion of the by-product through the hole can be suppressed more effectively. Therefore, it is possible to more effectively prevent a wiring defect caused by the resist poisoning phenomenon. In addition, the buried plug is set in an incomplete crosslinking state by the heat treatment at 50 to 200° C. and an active group remains in the film in addition to a low minuteness. Consequently, the buried plug can easily be decomposed with an oxygen plasma when ashing is to be carried out over the chemically amplified resist in the formation of the trench pattern, and can readily be removed with a dilute hydrofluoric acid solution, an amine based chemical solution or the like. Thus, it is possible to prevent surroundings from being influenced in the removal.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4 to 14 are sectional views showing a process for manufacturing an electronic device according to a first embodiment of the present invention, FIGS. 16 to 19 are sectional views showing a variant of the process for manufacturing an electronic device according to the first embodiment of the present invention, FIGS. 20 to 29 are sectional views showing a process for manufacturing an electronic device according to a second embodiment of the present invention, FIG. 31 is a sectional view showing a process for manufacturing an electronic device according to a third embodiment of the present invention.

DESCRIPTION OF THE PREFERRED EMBODIMENTS

<Resist Poisoning Phenomenon>

Prior to explanation of embodiments of the present invention, a resist poisoning phenomenon will further be described.

In a semiconductor device having a buried multilayer wiring structure, an etching stopper film is provided between an interlayer dielectric film and a structure of a lower layer and an upper protective film is provided on the interlayer dielectric film in many cases. In order to prevent a parasitic capacitance from being increased by employing a multilayer wiring structure to carry out an operation at a high speed, there is often used, as the interlayer dielectric film, an interlayer dielectric film having a low dielectric constant which is set to have a lower density and a lower dielectric constant than those of general silicon oxide by introduction of carbon into silicon oxide.

In such a structure, a by-product generated by decomposing and deteriorating a surface of the interlayer dielectric film having a low dielectric constant stays in an interface between the upper protective film and the interlayer dielectric film having a low dielectric constant during formation of the upper protective film or a by-product generated by decomposing and deteriorating the surface of the interlayer dielectric film having a low dielectric constant stays in an interface of the etching stopper film and the interlayer dielectric film having a low dielectric constant during formation of the etching stopper film in some cases. In these cases, the staying by-product is intensively discharged into a hole opening section by a heat treatment carried out in a photolithographic process, for example, by curing an anti-reflection coating.

The by-product contains a basic component. For this reason, it is supposed that a hydrogen ion generated in a chemically amplified resist to be used at a subsequent step is neutralized and deactivated, resulting in a resist poisoning phenomenon in which a resolution defect of a resist pattern is generated.

Figure 1:
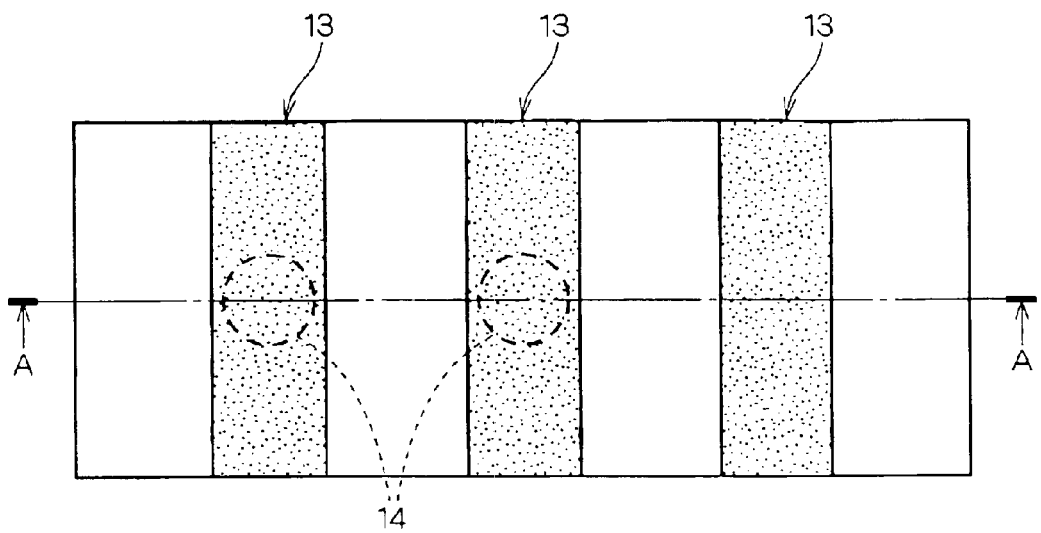
FIG. 1 is a plan view showing a normal wiring pattern.
Figure 2:
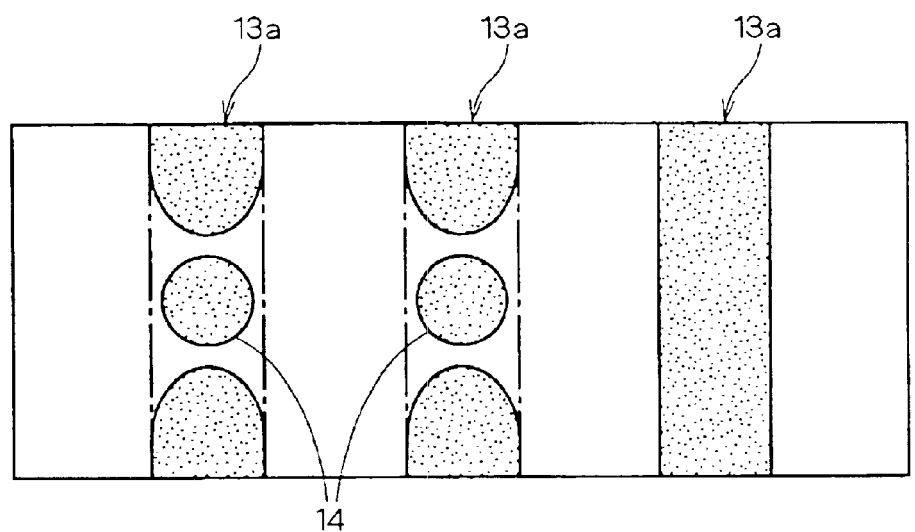
FIGS. 2 and 3 are plan views showing a wiring pattern for explaining a resist poisoning phenomenon.
Figure 3:
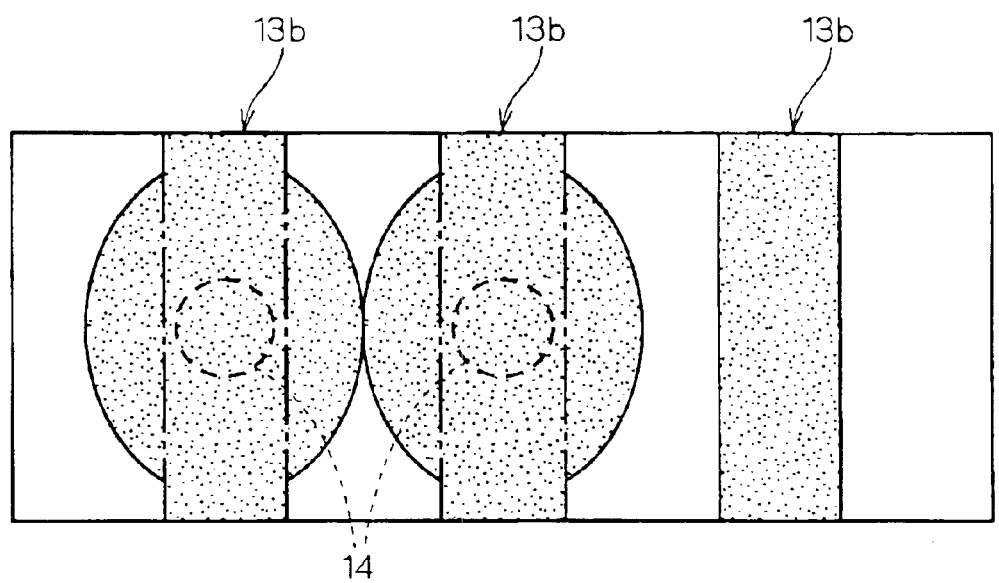

FIG. 1 shows a shape seen on a plane of a wiring pattern resolved normally, and FIGS. 2 and 3 illustrate a shape seen on a plane of the wiring pattern in case of a resolution defect.

In FIG. 1, three upper wirings 13 are provided with a spacing in parallel, and the upper wiring 13 on a left end and the upper wiring 13 on a center in the drawing are electrically connected through a via contact 14 to lower wirings which are not shown.

On the other hand, if a resolution defect is generated when a positive chemically amplified resist is used, the upper wiring 13 is disconnected around the via contact 14 so that a discontinuous upper wiring 13a is formed as shown in FIG. 2, for example. A broken line in the drawing indicates a contour with the upper wiring formed normally.

Moreover, if the resolution defect is generated when a negative chemically amplified resist is used, a resist material does not remain between the wirings so that such an upper wiring 13b as to cause an electrical short circuit between adjacent wirings is formed as shown in FIG. 3, for example.

Furthermore, these defects are also caused by a deteriorated layer generated on the surface of the interlayer dielectric film having a low dielectric constant in an internal wall portion of a hole during formation of the via hole or the contact hole. The deteriorated layer is also formed at a removing step through oxygen ashing of a resist material which is to be subsequently carried out in addition to etching, and the interlayer dielectric film having a low dielectric constant which is directly exposed to the etching and the ashing is decomposed and carbon disappears so that silicon oxide of poor quality (having a large number of defects) is formed. The deteriorated layer has such a property that a hygroscopicity is high and a structure is very unstable. It is known that the presence of the deteriorated layer further accelerates a resist poisoning phenomenon.

<A. First Embodiment>

As a first embodiment of the present invention, a method of manufacturing a semiconductor device 100 having a multilayer wiring structure will be described below with reference to FIGS. 4 to 14 to be sectional views showing a manufacturing process in order. A structure of the semiconductor device 100 is shown in FIG. 14 illustrating a final step. Moreover, the sectional views of FIGS. 4 to 14 correspond to sectional views taken along an A—A portion in FIG. 1.

<A-1. Manufacturing Method>

Figure 4:
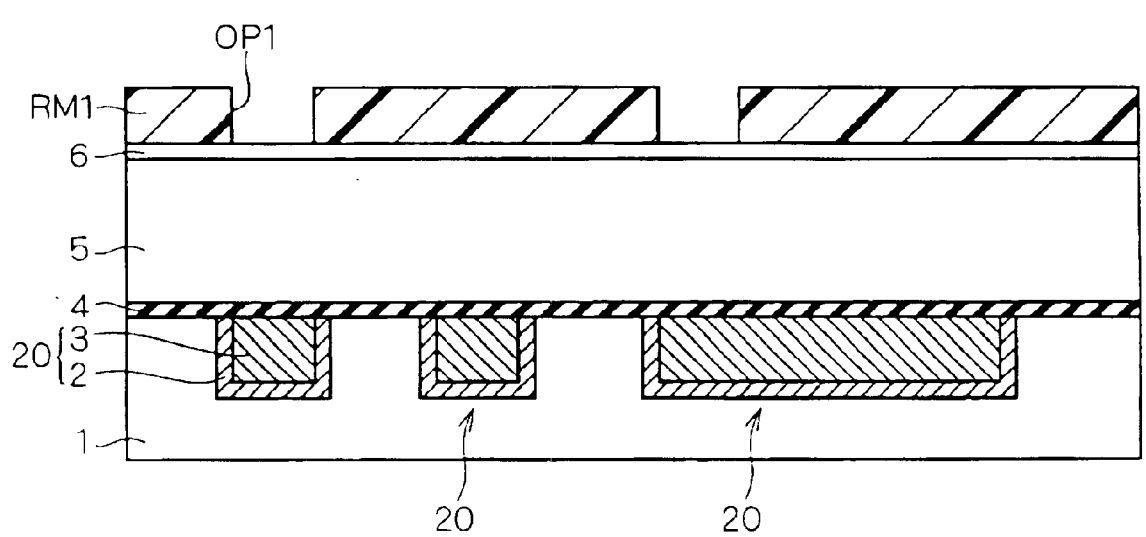

First of all, at a step shown in FIG. 4, a lower wiring 20 is formed by a general damascene method in a main surface of an underlying layer (for example, a silicon substrate) 1. The lower wiring 20 is formed by covering an internal wall of a trench formed in the main surface of the underlying layer 1 with a barrier metal layer 2 and burying a metal wiring layer 3 formed of copper or the like in a region surrounded by the barrier metal layer 2. The underlying layer 1 is not restricted to a silicon substrate but an interlayer dielectric film such as silicon oxide may be used. The present invention can be applied to any underlying layer.

Then, an etching stopper film 4 having a thickness of 50 to 100 nm is provided to cover the main surface of the underlying layer 1. An insulator material such as silicon nitride or silicon carbide is used for the etching stopper film 4, and the etching stopper film 4 is formed by a CVD (chemical vapor deposition) method, for example. The reason why the etching stopper film 4 is constituted by an insulator is that wirings are to be prevented from being electrically conducted and short-circuited by the etching stopper film 4.

Thereafter, an interlayer dielectric film 5 having a low dielectric constant which includes a siloxane bonding in a main structure is provided in a thickness of 500 to 1000 nm on the etching stopper film 4. A material having a relative dielectric constant of 3.0 or less, for example, a material such as a carbon-doped SiO film (which will also be referred to as an SiOC film) formed by the CVD method or methylsilsesquioxane (MSQ) formed by a coating method is used for the interlayer dielectric film 5 having a low dielectric constant in order to prevent a parasitic capacitance from being increased by employing a multilayer wiring structure and to carry out an operation at a high speed. For example, the methylsilsesquioxane is represented by $HO(-Si(CH_3)_2-O-)_nOH$. Since the SiOC film has hydrogen in the form of a methyl group ($CH_3$), it is indicated as an SiOCH film in some cases.

Subsequently, an upper protective film 6 having a thickness of 50 to 100 nm is provided on the interlayer dielectric film 5 having a low dielectric constant in order to prevent invasion of a substance to influence an element characteristic or to prevent the interlayer dielectric film 5 having a low dielectric constant from being deteriorated in a manufacturing process. A silicon oxide film formed by the CVD method or the like is used for the upper protective film 6, for example. In some cases, an anti-reflection coating constituted by a silicon nitride oxide film (SiON) or the like or an anti-reflection coating constituted by an organic resin is used as the upper protective film 6 or a laminating structure of the silicon nitride-oxide film and the silicon oxide film is employed in some cases.

A resist pattern RM1 to form a via hole for a connection to the lower wiring 20 is provided on the upper protective film 6 by photolithography. In the resist pattern RM1, a portion corresponding to a position in which the via hole is formed serves as an opening section OP1.

Figure 5:
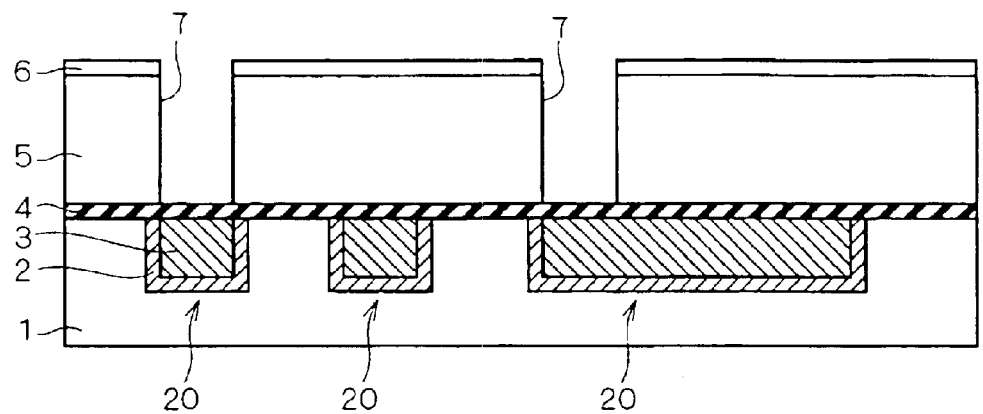

At a step shown in FIG. 5, next, the upper protective film 6 and the interlayer dielectric film 5 having a low dielectric constant in a portion corresponding to the opening section OP1 of the resist pattern RM1 are etched by a dry etching method with the resist pattern RM1 to be an etching mask so that a via hole 7 reaching the etching stopper film 4 is formed. At this time, there is employed an etching condition that the etching stopper film 4 is not removed. Then, the resist pattern RM1 is removed by oxygen etching (which will also be referred to as ashing) using a plasma such as oxygen.

Thereafter, annealing is carried out at 300 to 400° C. with the via hole 7 opened. During the annealing, an atmosphere, an oxygen atmosphere or an inert gas atmosphere such as nitrogen may be selected. Moreover, annealing in a vacuum is also effective.

For the annealing, it is possible to employ both a method using a hot plate and a method using a heat treating furnace. In order to suppress an influence on the lower wiring 20 which has been manufactured, it is effective that heating is carried out in a short time of approximately 5 to 10 minutes by using the hot plate.

Consequently, a by-product staying in an interface of the upper protective film 6 and the interlayer dielectric film 5 having a low dielectric constant and a by-product staying in an interface of the etching stopper film 4 and the interlayer dielectric film 5 having a low dielectric constant are discharged so that an amount of the residual by-product can be decreased.

At this time, moreover, water adsorbed into the deteriorated layer formed on an internal wall of the via hole 7 is also discharged so that a surface condition of the deteriorated layer can also be reformed.

In order to further reform the deteriorated layer in the via hole 7, a hydrophobic treatment using a silane coupling material such as hexamethyldisilazane (HMDS) is effective. Consequently, the deteriorated layer is reformed and the hydrophobic treatment is carried out at the same time. Thus, the water can be prevented from being reabsorbed after the annealing.

A general known technique can be applied to a hydrophobic treating method. For example, in the case in which the HMDS is to be used, the hydrophobic treatment can be carried out by bubbling and vaporizing the HMDS with an $N_2$ gas or the like and thereby exposing a substrate heated to 100 to 120° C. to an HMDS atmosphere.

Figure 6:
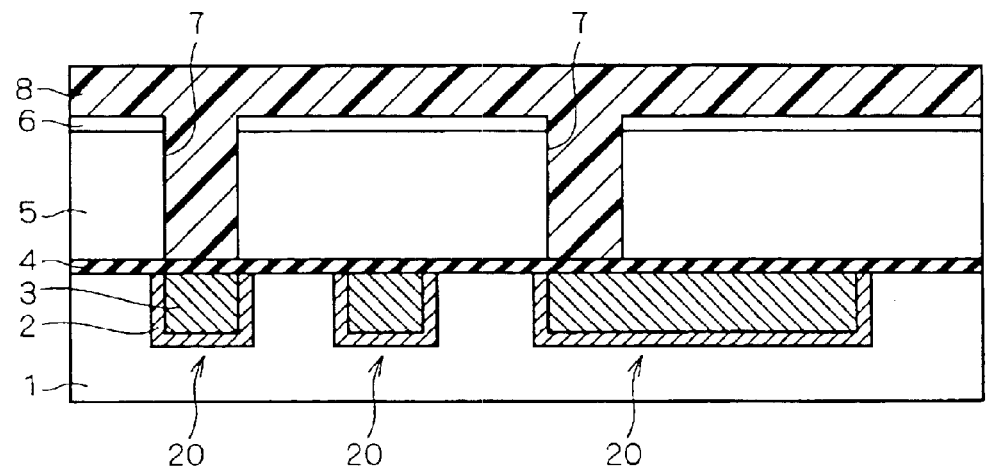

At a step shown in FIG. 6, next, an organic resin 8 such as a resist material is applied to the whole surface of the substrate and is also filled in the via hole 7. It is desirable that the organic resin 8 should be formed by a material which is cured through only irradiation of a deep ultraviolet light (DUV: an ultraviolet light having a wavelength of approximately 300 nm or less) and is not redissolved during the formation of the anti-reflection coating and the application of the resist which are to be carried out later. For example, a novolac resin or an acryl resin is used.

Figure 7:
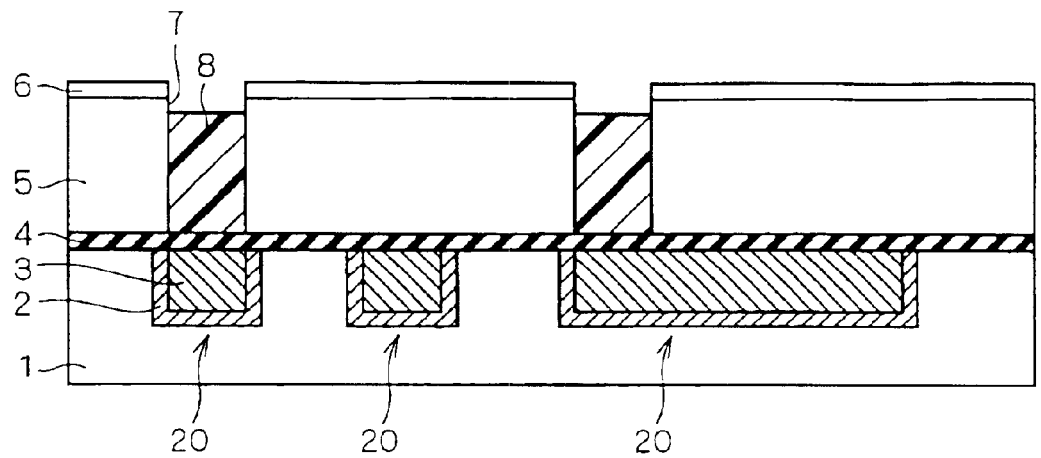

At a step shown in FIG. 7, then, the whole surface of the substrate is etched by an oxygen plasma or the like to completely remove at least the organic resin 8 provided on the upper protective film 6. At this time, an etching condition is set to maintain a state in which the organic resin 8 is filled in the via hole 7. In order to prevent the organic resin 8 from being protruded from the via hole 7 and to completely remove the organic resin 8 provided on the upper protective film 6, the etching condition is set to cause slight over-etching. Therefore, there is no problem even if the organic resin 8 is removed corresponding to a thickness of the upper protective film 6 over the via hole 7.

For example, a retreat may be carried out by 100 to 150 nm from a main surface of the upper protective film 6 in consideration of a variation in a process.

Moreover, the organic resin 8 provided on the upper protective film 6 is completely removed for the following reason. If a resist pattern for forming an upper wiring which will be described below is provided with the unnecessary organic resin 8 remaining on the upper protective film 6, a shape of the resist pattern becomes nonuniform. In order to prevent a drawback from being caused over a finished shape of the upper wiring, the organic resin 8 provided on the upper protective film 6 is removed completely. If a thickness of the remaining organic resin 8 can be controlled to be much smaller than that of the resist pattern, for example, the thickness of the organic resin 8 provided on the upper protective film 6 is set to be 5% or less of that of the resist pattern, etch-back of the organic resin 8 may be interrupted.

Figure 8:
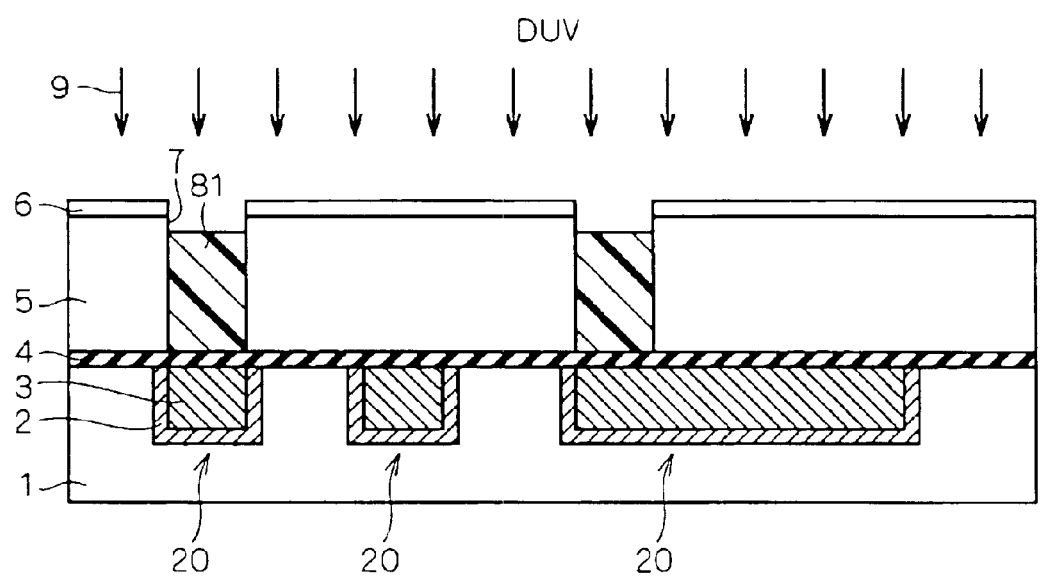

At a step shown in FIG. 8, thereafter, a DUV light 9 is irradiated on the whole surface of the substrate to cure the organic resin 8 remaining in the via hole 7. Consequently, a buried plug 81 is formed. The DUV light 9 is an ultraviolet light having a wavelength of 300 nm or less and a general high pressure mercury vapor lamp can be used for a light source.

Figure 9:
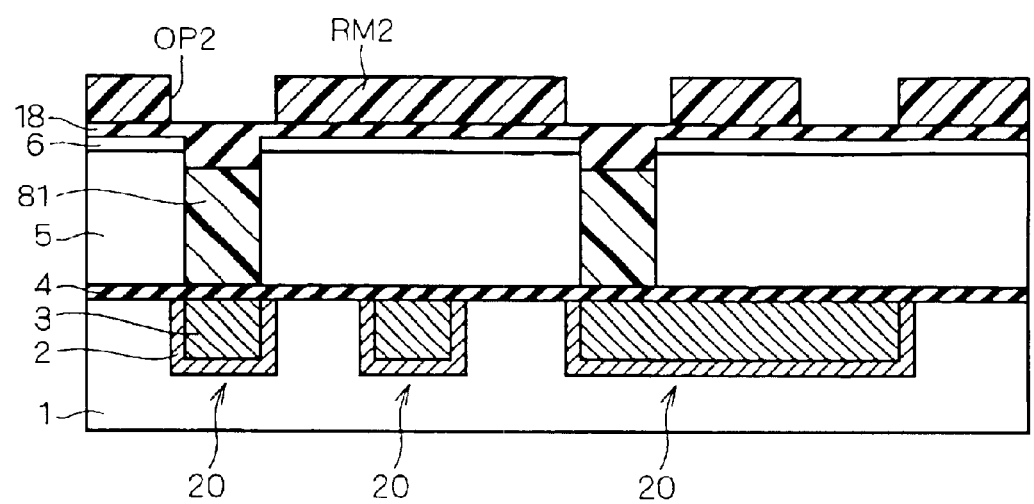

At a step shown in FIG. 9, subsequently, an anti-reflection coating 18 having a thickness of approximately 80 nm is formed on the whole surface of the substrate. The anti-reflection coating 18 is provided to reduce a reflectance of an irradiated light over a semiconductor substrate in a photolithographic process, and a bottom anti-reflection coating (BARC) or the like which is formed by a spin coating method is preferably used, for example.

After the anti-reflection coating 18 is formed, the anti-reflection coating 18 is coated with a chemically amplified resist. Thus, a resist pattern RM2 having an opening section OP2 which is coincident with a provision pattern of an upper wiring to be formed later is provided by photolithography.

Figure 10:
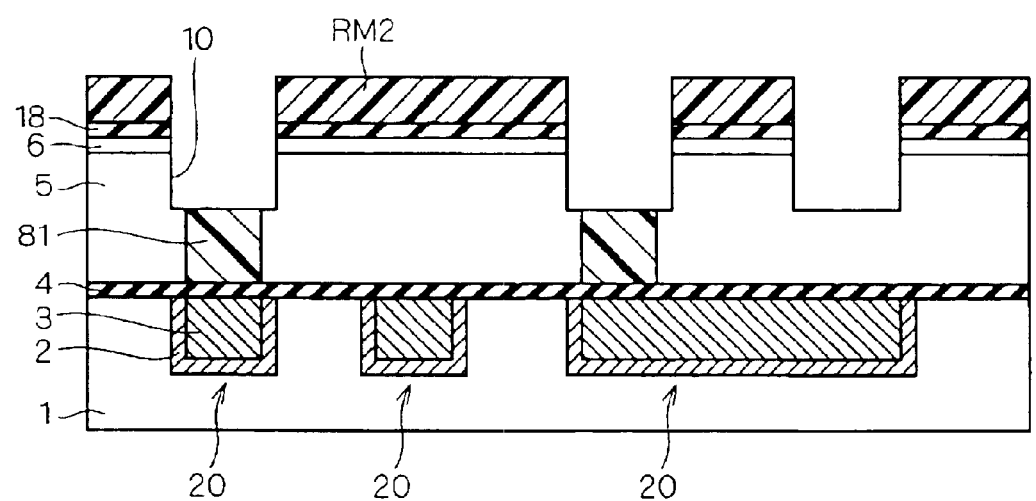

At a step shown in FIG. 10, then, the anti-reflection coating 18, the upper protective film 6, the interlayer dielectric film 5 having a low dielectric constant and the buried plug 81 in a portion corresponding to the opening section OP2 of the resist pattern RM2 are removed by a dry etching method. Thus, a trench pattern 10 for burying the upper wiring is formed. In this case, a depth of the trench pattern 10 to be formed is regulated based on an etching time.

At a step shown in FIG. 11, thereafter, the buried plug 81 remaining in the via hole 7, the anti-reflection coating 18 provided on the upper protective film 6 and the resist pattern RM2 are removed by oxygen ashing using a plasma such as oxygen.

At a step shown in FIG. 12, subsequently, the etching stopper film 4 exposed to a bottom portion of the via hole 7 is removed by etching so that the lower wiring 20 is exposed.

Figure 13:
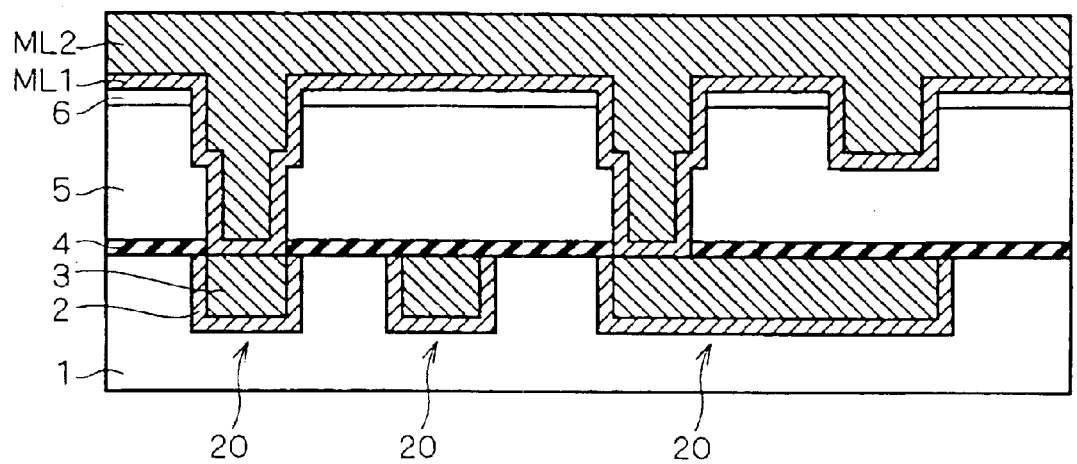
Figure 14:
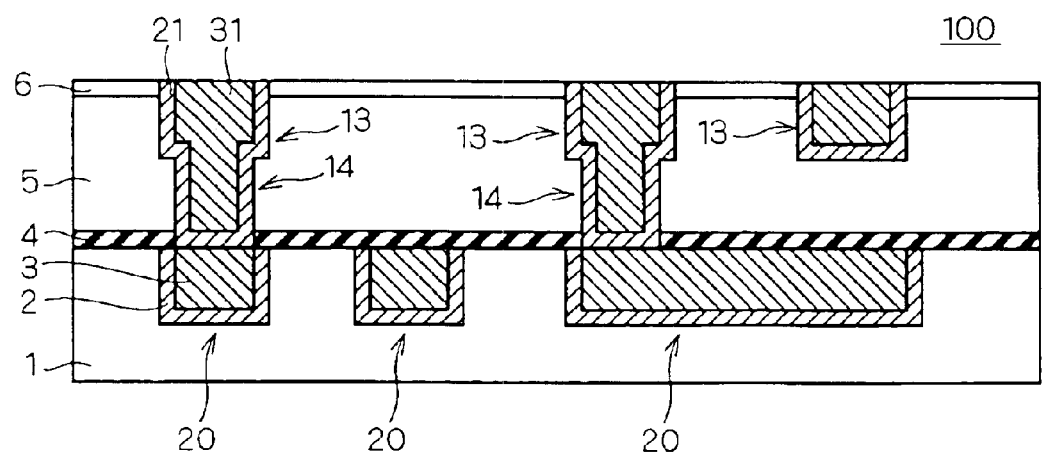

At a step shown in FIG. 13, next, internal walls of the trench pattern 10 and the via hole 7 are covered with a barrier metal layer ML1 having a thickness of 20 to 40 nm which is constituted by tantalum nitride formed by a sputtering method, for example, and a metal layer ML2 constituted by copper which is deposited by a plating method is buried in a region surrounded by the barrier metal layer ML1, for example.

At a step shown in FIG. 14, finally, the unnecessary barrier metal layer ML1 and metal layer ML2 which remain on the upper protective film 6 are removed by a CMP (Chemical Mechanical Polishing) method or the like. Consequently, an upper wiring 13 constituted by a barrier metal layer 21 and a metal layer 31 is obtained, and at the same time, the barrier metal layer 21 and the metal layer 31 are also buried in the via hole 7 so that a via contact 14 can be obtained. The via contact 14 is connected to the lower wiring 20. Consequently, an electrical connection of the upper wiring 13 and the lower wiring 20 can be achieved. Through the steps described above, the semiconductor device 100 having a buried multilayer wiring structure can be obtained.

The barrier metal layer ML1 is not restricted to tantalum nitride but a material to be a barrier to a metal to be used for the metal layer ML2, for example, titanium nitride, tungsten nitride or titanium nitride silicide is preferably selected properly, and furthermore, is not restricted to one kind but a plurality of materials may be combined. Moreover, the forming method is not restricted to the sputtering method but the CVD method can also be used. In some cases, the barrier metal layer ML1 is not indispensable depending on the material of the metal layer ML2. In addition, it is also possible to form the upper wiring 13 and the via contact 14 by burying, as the metal layer ML2, a conductor material such as tungsten, platinum, ruthenium or gold in place of copper.

<A-2. Function and Effect>

As described above, according to the method of manufacturing a semiconductor device in accordance with the first embodiment, the via hole 7 is formed on the interlayer dielectric film 5 having a low dielectric constant including the siloxane bonding in the main structure and the annealing is then carried out at 300 to 400° C. Consequently, the by-product staying in the interface of the upper protective film 6 and the interlayer dielectric film 5 having a low dielectric constant or the by-product staying in the interface of the etching stopper film 4 and the interlayer dielectric film 5 having a low dielectric constant is discharged so that the amount of the residual by-product can be decreased. Consequently, the chemically amplified resist to be used for forming the trench pattern 10 to bury the upper wiring can be prevented from being deactivated by the by-product and the resist poisoning phenomenon causing the resolution defect of a resist pattern can be prevented from being generated. As a result, it is possible to obtain a semiconductor device having a buried multilayer wiring structure in which a resolution defect of the resist pattern is prevented from being generated and generation of the defective wiring caused by the resolution defect is reduced.

In this case, moreover, the water adsorbed into the deteriorated layer formed on the internal wall of the via hole 7 is also discharged so that the surface condition of the deteriorated layer can also be reformed. Consequently, the resist poisoning phenomenon can also be prevented from being accelerated by the presence of the deteriorated layer.

In order to further reform the deteriorated layer in the via hole 7, furthermore, the hydrophobic treatment is carried out by using the silane coupling material such as hexamethyldisilazane. Consequently, the water can be prevented from being reabsorbed after the annealing and the resist poisoning phenomenon can be more reliably prevented from being generated.

Moreover, a dielectric film having a low dielectric constant (which will be referred to as a Low-k material) including a siloxane bonding in a main structure is used as the interlayer dielectric film 5 having a low dielectric constant. Consequently, it is possible to utilize the same dry etching as that for a silicon oxide film. Since the dielectric film having the siloxane bonding in the main structure is more excellent in a heat resistance and has a higher mechanical strength as compared with other organic resins to be the Low-k materials, it is suitable for the interlayer dielectric film. Since the same dielectric film has a resistance to resist ashing by an oxygen plasma, furthermore, oxygen ashing can be used for removing a resist. In addition, since the dielectric film can be formed by a spin coating method, a plasma CVD method or the like, the forming method has a large selection. Since the methylsilsesquioxane is not dissolved in hydrofluoric acid, moreover, a selectivity with the silicon oxide film can be maintained.

Furthermore, the organic resin 8 to be cured by the DUV light 9 is filled in the via hole 7 and is cured to form the buried plug 81. In that state, the anti-reflection coating 18 or the like is formed. Consequently, it is possible to reduce a variation in the thickness of the anti-reflection coating depending on a via hole density during photolithography. This effect will further be described with reference to FIG. 15.

Figure 15:
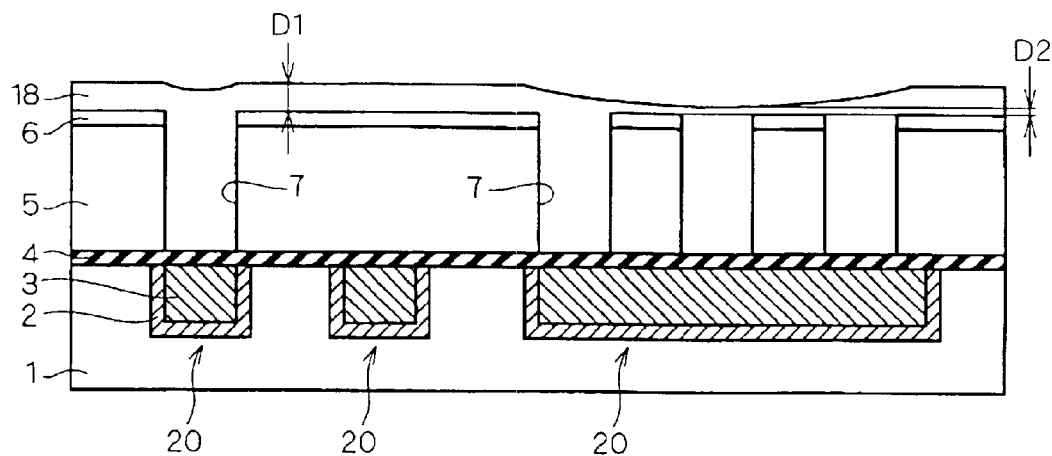
FIG. 15 is a sectional view for explaining a variation in a thickness of an anti-reflection coating depending on a hole density.

FIG. 15 is a sectional view showing a state in which the anti-reflection coating 18 is formed without using the buried plug 81, and the same structures as those in the semiconductor device 100 shown in FIG. 14 have the same reference numerals and repetitive description will be omitted.

FIG. 15 shows a state in which the provision density of the via hole 7 is varied. In the drawing, a plurality of via holes 7 are densely provided in a region on the right side and one via hole 7 is isolated in a region on the left side. When an anti-reflection coating agent is applied, it is absorbed into the via hole 7. In the region in which the via hole 7 is densely provided, the amount of the anti-reflection coating agent per unit area which is sucked into the via hole 7 is large and the anti-reflection coating 18 has a thickness D2. On the other hand, in the region in which the via hole 7 is not densely provided, the amount of the anti-reflection coating agent per unit area which is sucked into the via hole 7 is small and the anti-reflection coating 18 has a thickness D1 (D1>D2). As a result, a variation in the thickness of the anti-reflection coating is made. However, the via hole 7 is filled with the buried plug 81 so that the amount of the anti-reflection coating agent per unit area which is sucked into the via hole 7 can be prevented from being varied depending on the provision density of the via hole 7. Consequently, the variation in the thickness of the anti-reflection coating can be reduced. By uniformly forming the anti-reflection coating, a distance between the via hole 7 and the resist pattern RM2 can be maintained to be constant over the whole region of the substrate and the influence of the deteriorated layer in the via hole 7 and that of the by-product can be prevented from being varied depending on a place. As a result, moreover, it is also possible to reduce a variation in a thickness of the wiring.

Since it is not necessary to cause the buried plug 81 to have an anti-reflection function, the range of selection of a material is extended. If a resin to be thermally cured by a heat treatment at a high temperature is used, a by-product is discharged by the heat treatment so that a resist poisoning phenomenon is caused. Consequently, it is essential that a resin is cured by only irradiation of a DUV light.

In order to form the trench pattern 10 for burying the upper wiring, the buried plug 81 is also removed by etching together with the interlayer dielectric film 5 having a low dielectric constant. For this reason, it is further preferable to use a material having an etching rate which is equal to or more than that of the interlayer dielectric film 5 having a low dielectric constant.

As compared with the case in which the buried plug 81 is not used but limited kinds of anti-reflection coating agents are directly applied, moreover, it is more preferable that any of various resins which has a high capability of burying the via hole 7 and a characteristic capable of suppressing diffusion of a by-product should be selected for the material of the buried plug 81. Consequently, it becomes possible to broaden the scope of selection of a material and also have a larger selection of the structure of the semiconductor device.

In some cases in which a film having an anti-reflection function which is constituted by an inorganic material such as a silicon nitride oxide film is used for the upper protective film 6, it maintains the anti-reflection function also in the photolithography of the wiring pattern of the upper layer. Therefore, the application of the anti-reflection coating 18 can be omitted. Also-in this case, it is apparent that the same effects as those described above can be essentially obtained.

<A-3. Variant>

While the structure in which the buried plug 81 is formed by an organic resin has been employed in the method of manufacturing a semiconductor device according to the first embodiment of the present invention described above, it is also possible to use an SOG (Spin On Glass) material such as hydrogen silsesquioxane (HSQ) in place of the organic resin as will be described below with reference to FIGS. 16 to 19.

More specifically, a via hole 7 penetrating through an interlayer dielectric film 5 having a low dielectric constant to reach an etching stopper film 4 is formed through the same steps as those described with reference to FIGS. 4 and 5.

Figure 16:
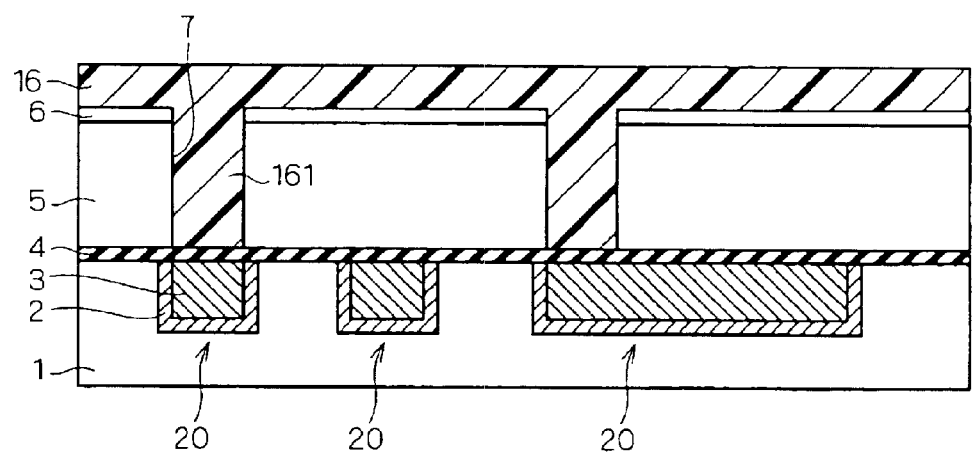

At a step shown in FIG. 16, then, an SOG material is applied in a thickness of 100 to 200 nm over a whole surface of a substrate so that an SOG film 16 is formed. At this time, the SOG material is also filled in the via hole 7. A heat treatment is carried out at a temperature of 50 to 200° C. for 10 minutes or less, desirably 1 to 2 minutes to volatilize a solvent contained in the SOG film 16 and to progress a weak crosslinking reaction, thereby preventing redissolution when applying a resist material at a subsequent step. After this step, the SOG film 16 in the via hole 7 will be referred to as a buried plug 161.

In this case, when a heat treatment is carried out at a high temperature for a long time, the crosslinking reaction of the SOG material progresses and the SOG film 16 is thereby densified so that a hindrance is caused, for example, removal is hard to perform. For this reason, it is desirable that the heat treatment should be carried out at a low temperature for a short time (1 to 2 minutes) as described above in such a manner that the redissolution is not carried out. Then, the SOG film 16 provided on an upper protective film 6 is removed by etching a whole surface with a fluorocarbon based etching agent.

In the etching using the fluorocarbon based etching agent, it is hard for the SOG film 16 to maintain a selectivity ratio to the upper protective film 6. Therefore, an etching condition is desirably set in such a manner that the SOG film 16 provided on the upper protective film 6 is not completely removed but the etching is stopped when the SOG film 16 is removed to have a predetermined thickness. Alternatively, it is also possible to employ a structure in which the SOG film 16 is not removed.

At a step shown in FIG. 17, next, a chemically amplified resist is applied onto the SOG film 16 to form a resist pattern RM11 having an opening section OP11 which is coincident with a provision pattern of an upper wiring to be formed later by photolithography.

At a step shown in FIG. 18, then, the SOG film 16, the upper protective film 6, the interlayer dielectric film 5 having a low dielectric constant and the buried plug 161 in the via hole 7 in a portion corresponding to the opening section OP11 of the resist pattern RM11 are removed by a dry etching method, and a trench pattern 10 for burying the upper wiring is thus formed. At this time, a depth of the trench pattern 10 to be formed is regulated based on an etching time.

At a step shown in FIG. 19, thereafter, the resist pattern RM11 is removed by oxygen ashing using an oxygen plasma. At this time, a condition is set in such a manner that the buried plug 161 remains in the via hole 7. Even if the buried plug 161 is removed to some extent in an upper part of the via hole 7, there is no problem.

Subsequently, the buried plug 161 filled in the via hole 7 and the SOG film 16 provided on the upper protective film 6 are removed with chemicals rarely etching the upper protective film 6 and the interlayer dielectric film 5 having a low dielectric constant, for example, a dilute hydrofluoric acid solution diluted to have a ratio of water to hydrofluoric acid of 100 to 1 or more, an amine based chemical solution or the like.

By carrying out the steps described with reference to FIGS. 12 to 14, subsequently, it is possible to obtain a semiconductor device 100.

The buried plug 161 constituted by the hydrogen silsesquioxane described above is hydrophobic and has such a characteristic that diffusion of a by-product through the via hole 7 can be more suppressed than that in the case in which an organic resin is used as a plug. Therefore, it is possible to more effectively prevent a wiring defect from being caused by a resist poisoning phenomenon.

Moreover, the buried plug 161 has a low minuteness due to incomplete crosslinking and an active group remains in a film. Therefore, the buried plug 161 can easily be decomposed with an oxygen plasma during ashing of the resist pattern RM11 and can readily be removed with the dilute hydrofluoric acid solution, the amine based chemical solution or the like. Consequently, it is possible to prevent surroundings from being influenced during the removal.

As an SOG material for forming the buried plug 161, it is also possible to use a material having such a structure that methylsilsesquioxane (MSQ) and hydrogen silsesquioxane (HSQ) are mixed on a chemical bonding basis and a methyl group ($CH_3$) of a part of the MSQ is substituted for hydrogen.

<B. Second Embodiment>

Figure 28:
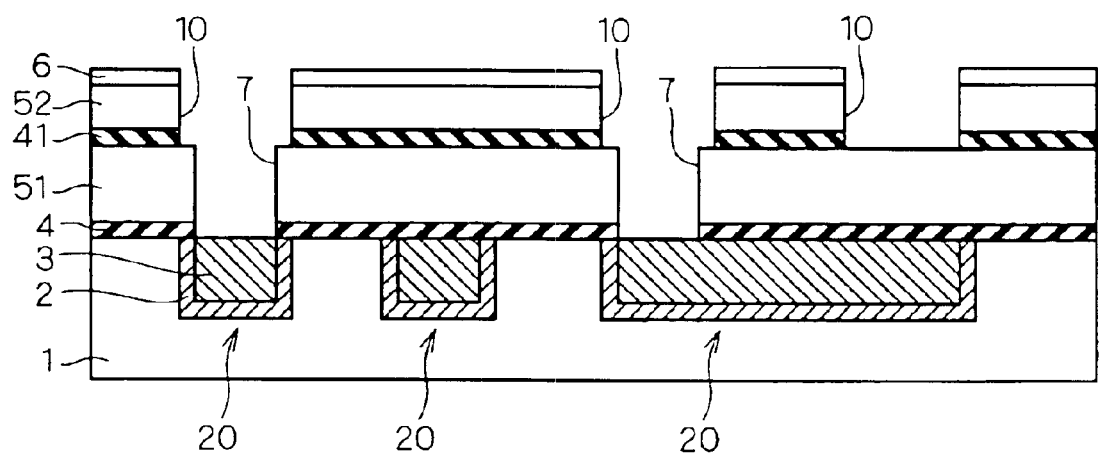
Figure 29:
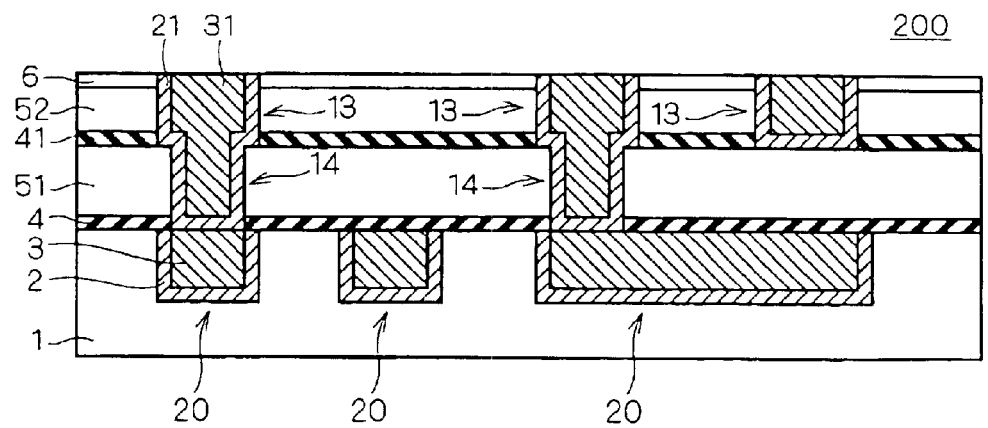

As a second embodiment of the present invention, a method of manufacturing a semiconductor device 200 having a multilayer wiring structure will be described below with reference to FIGS. 20 to 29 to be sectional views showing a manufacturing process in order. A structure of the semiconductor device 200 is shown in FIG. 29 illustrating a final step. Moreover, the same structures as those in FIGS. 1 to 14 have the same reference numerals and repetitive description will be omitted.

<B-1. Manufacturing Method>

At a step shown in FIG. 20, first of all, an interlayer dielectric film 51 having a low dielectric constant including a siloxane bonding in a main structure is provided in a thickness of 200 to 1000 nm on an etching stopper film 4 of an insulator, for example. A material such as a carbon-doped SiO film formed by a CVD method, methylsilsesquioxane (MSQ) formed by a coating method or the like is used for the interlayer dielectric film 51 having a low dielectric constant.

Then, an etching stopper film 41 having a thickness of 50 to 100 nm is provided to cover a main surface of the interlayer dielectric film 51 having a low dielectric constant. A material such as silicon nitride or silicon carbide is used for the etching stopper film 41 and the etching stopper film 41 is formed by the CVD method, for example.

Furthermore, an interlayer dielectric film 52 having a low dielectric constant including a siloxane bonding in a main structure is provided in a thickness of 200 to 1000 nm on the etching stopper film 41, for example, and an upper protective film 6 having a thickness of 50 to 100 nm is provided on the interlayer dielectric film 52 having a low dielectric constant. The thicknesses of the interlayer dielectric films 51 and 52 having low dielectric constants are set corresponding to a structure of an element to be required and the values described above should be a standard. For example, it is desirable that the thickness of the interlayer dielectric film 51 having a low dielectric constant should be set corresponding to a predetermined space between upper and lower wirings and that of the interlayer dielectric film 52 having a low dielectric constant should be set to correspond to a thickness of an upper wiring to be formed later.

Then, a resist pattern RM1 to form a via hole for a connection to a lower wiring 20 is provided on the upper protective film 6 by photolithography. In the resist pattern RM1, a portion corresponding to a position in which the via hole is formed serves as an opening section OP1 and a chemically amplified resist is used.

Figure 21:
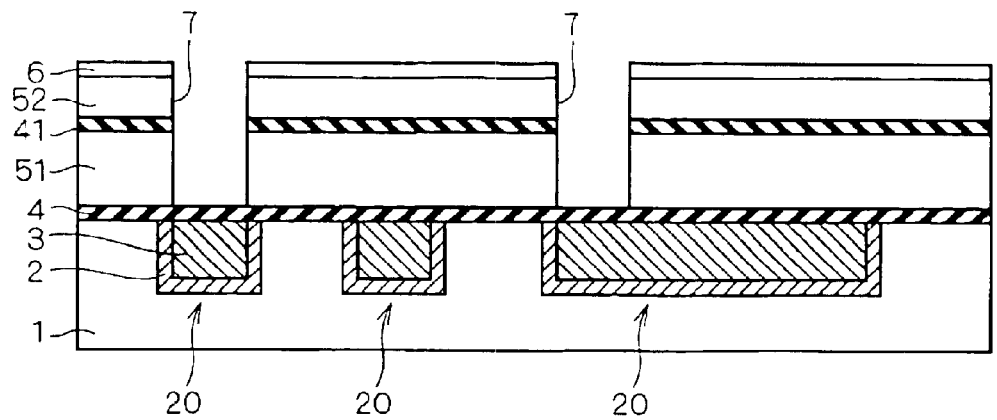

At a step shown in FIG. 21, next, the upper protective film 6 and the interlayer dielectric film 52 having a low dielectric constant in a portion corresponding to the opening section OP1 of the resist pattern RM1 are etched by a dry etching method using the resist pattern RM1 as an etching mask, and furthermore, an etching condition is changed in such a manner that the etching stopper film 41 can be removed, and the etching stopper film 41 is thus removed and the etching condition is changed again to etch the interlayer dielectric film 51 having a low dielectric constant, thereby forming a via hole 7 reaching the etching stopper film 4. In this case, there is employed an etching condition that the etching stopper film 4 is not removed. By properly selecting the etching condition, moreover, it is also possible to continuously process the interlayer dielectric film 52 having a low dielectric constant, the etching stopper film 41 and the interlayer dielectric film 51 having a low dielectric constant on one condition. In this case, it is desirable that the condition should be changed before exposure of the etching stopper film 4 to carry out regulation, for example, maintenance of a selectivity ratio. Then, the resist pattern RM1 is removed by oxygen ashing using a plasma such as oxygen.

Thereafter, annealing is carried out at 300 to 400° C. with the via hole 7 opened.

Consequently, by-products staying in an interface of the upper protective film 6 and the interlayer dielectric film 52 having a low dielectric constant, an interface of the interlayer dielectric films 51 and 52 having low dielectric constants and the etching stopper film 41, and an interface of the etching stopper film 4 and the interlayer dielectric film 51 having a low dielectric constant are discharged so that an amount of the residual by-product can be decreased.

At this time, moreover, water adsorbed into the deteriorated layer formed on an internal wall of the via hole 7 is also discharged so that a surface condition of the deteriorated layer can also be reformed. It is apparent that a hydrophobic treatment using a silane coupling material such as hexamethyldisilazane (HMDS) may be carried out.

Figure 22:
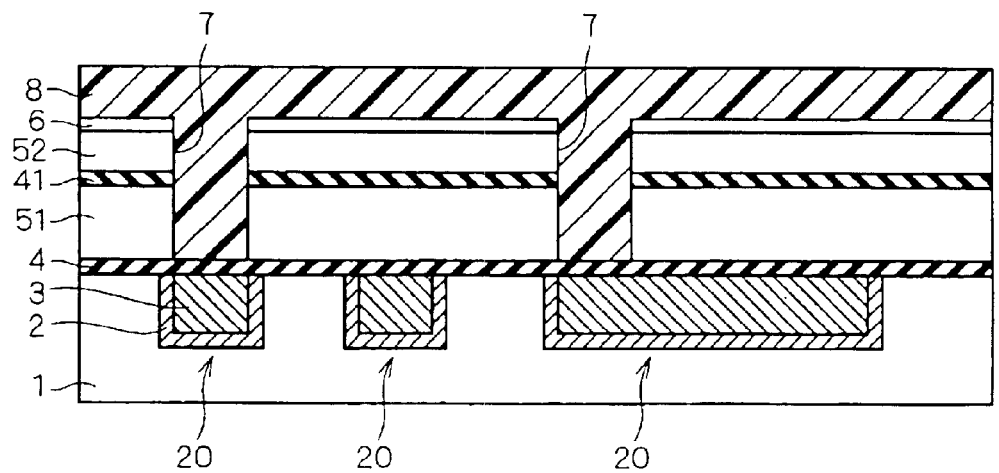

At a step shown in FIG. 22, next, an organic resin 8 such as a resist material is applied to a whole surface of a substrate and is also filled in the via hole 7.

Figure 23:
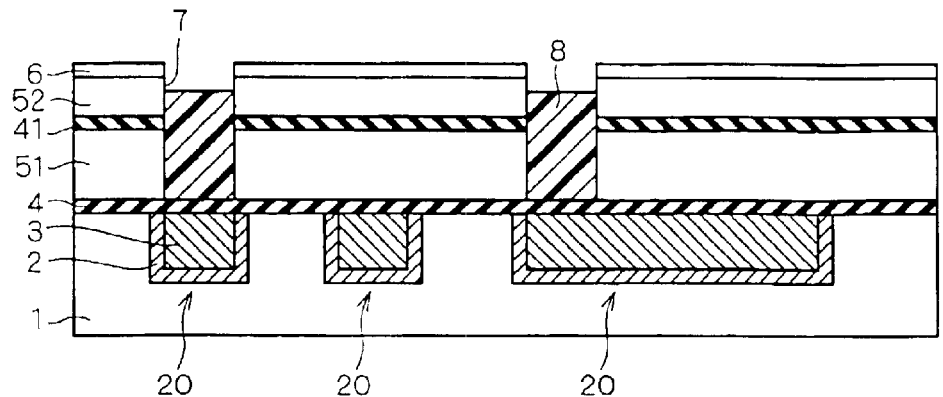

At a step shown in FIG. 23, then, the whole surface of the substrate is etched with an oxygen plasma or the like, thereby completely removing at least the organic resin 8 provided on the upper protective film 6. At this time, an etching condition is set to maintain a state in which the organic resin 8 is filled in the via hole 7.

Figure 24:
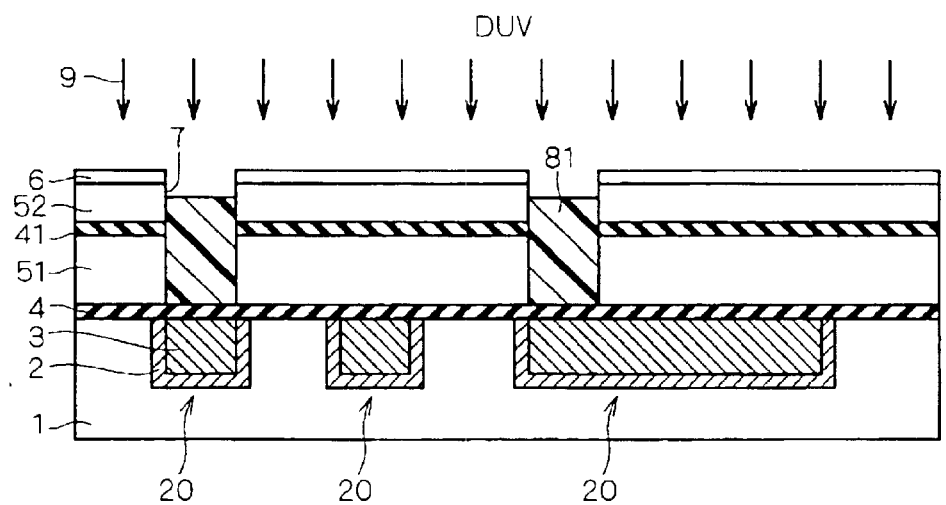

At a step shown in FIG. 24, thereafter, a DUV light 9 is irradiated on the whole surface of the substrate to cure the organic resin 8 remaining in the via hole 7. Consequently, a buried plug 81 is formed. The DUV light 9 is an ultraviolet light having a wavelength of 300 nm or less and a general high pressure mercury vapor lamp can be used for a light source.

Figure 25:
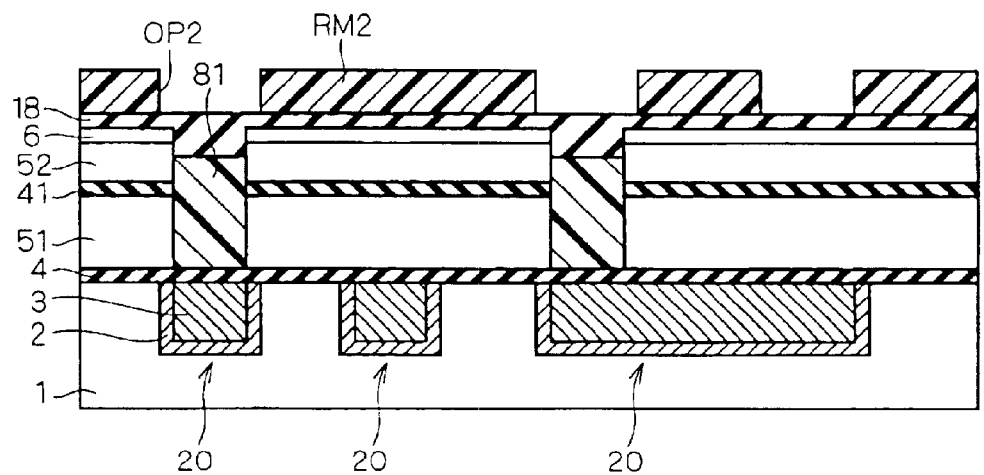

At a step shown in FIG. 25, subsequently, an anti-reflection coating 18 having a thickness of approximately 80 nm is formed on the whole surface of the substrate.

After the anti-reflection coating 18 is formed, a resist material is applied onto the anti-reflection coating 18. Thus, a resist pattern RM2 having an opening section OP2 which is coincident with a provision pattern of an upper wiring to be formed later is provided by photolithography.

Figure 26:
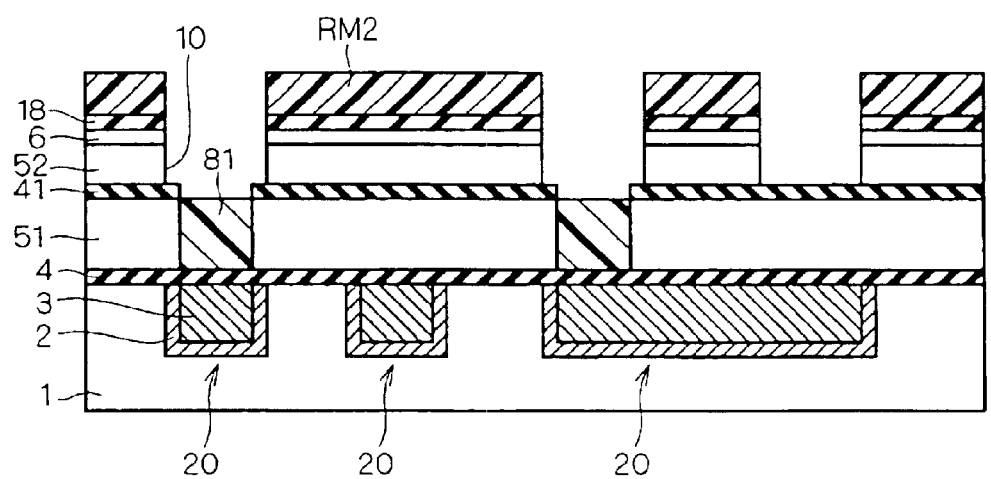

At a step shown in FIG. 26, then, the anti-reflection coating 18, the upper protective film 6, the interlayer dielectric film 52 having a low dielectric constant, the etching stopper film 41 and the buried plug 81 in a portion corresponding to the opening section OP2 of the resist pattern RM2 are removed by a dry etching method. Thus, a trench pattern 10 for burying the upper wiring is formed. In this case, a depth of the trench pattern 10 to be formed is almost defined by a thickness of the interlayer dielectric film 52 having a low dielectric constant.

Figure 27:
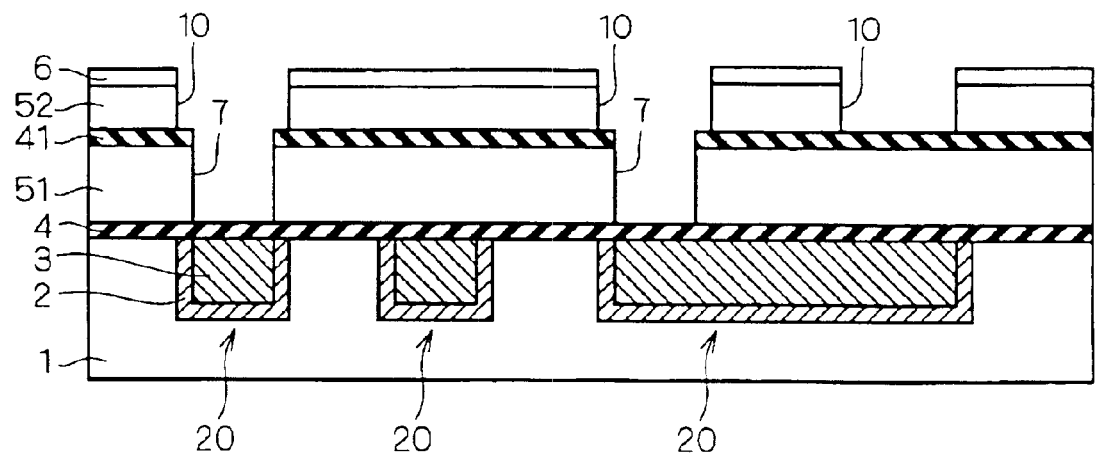

At a step shown in FIG. 27, thereafter, the buried plug 81 remaining in the via hole 7, the anti-reflection coating 18 provided on the upper protective film 6 and the resist pattern RM2 are removed by oxygen ashing using a plasma such as oxygen.

At a step shown in FIG. 28, subsequently, the etching stopper film 4 exposed to a bottom portion of the via hole 7 is removed by etching to expose the lower wiring 20.

Next, internal walls of the trench pattern 10 and the via hole 7 are covered with a barrier metal layer and a metal layer constituted by copper is buried in a region surrounded by the barrier metal layer. At a step shown in FIG. 29, subsequently, the unnecessary barrier metal layer and metal layer which remain on the upper protective film 6 are removed. Consequently, an upper wiring 13 constituted by a barrier metal layer 21 and a metal layer 31 can be obtained, and at the same time, the barrier metal layer 21 and the metal layer 31 are also buried in the via hole 7 so that a via contact 14 can be obtained. Through the steps described above, the semiconductor device 200 having a buried multilayer wiring structure can be obtained.

<B-2. Function and Effect>

As described above, according to the method of manufacturing a semiconductor device in accordance with the second embodiment, it is possible to obtain a semiconductor device having a buried multilayer wiring structure in which generation of a resolution defect of a resist pattern is suppressed and generation of a defective wiring caused by the resolution defect is reduced in the same manner as the method of manufacturing a semiconductor device according to the first embodiment.

Moreover, the etching stopper film 41 is provided in the middle of the interlayer dielectric film having a low dielectric constant. When the trench pattern 10 for burying an upper wiring is to be formed, consequently, the etching is stopped at the etching stopper film 41. Consequently, the depth of the trench pattern 10 can be defined in self-alignment and an etching time does not need to be managed strictly. Thus, the manufacturing process can be simplified.

<B-3. Variant>

In the method of manufacturing a semiconductor device according to the second embodiment of the present invention described above, the etching stopper film 41 is provided in the middle of the interlayer dielectric film having a low dielectric constant. By employing a two-layer structure having different kinds of interlayer dielectric films, similarly, the same effects can be obtained.

Figure 30:
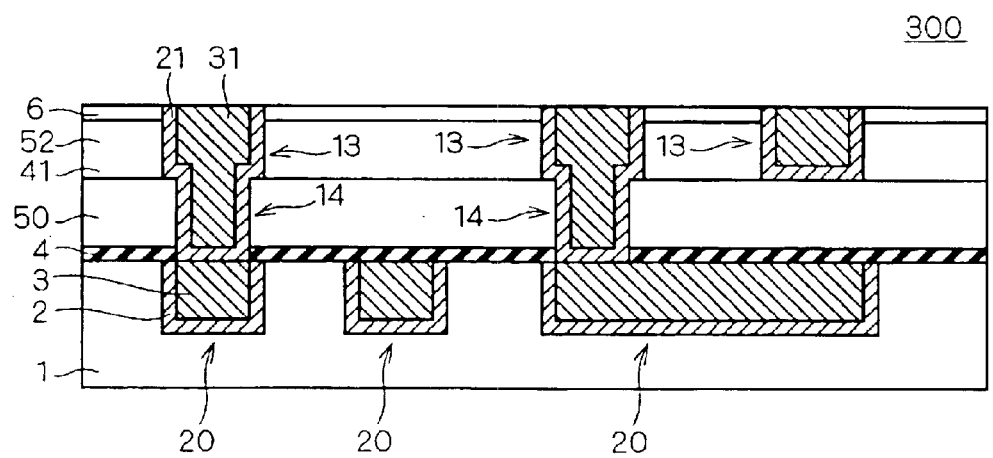
FIG. 30 is a sectional view showing a variant of the process for manufacturing an electronic device according to the second embodiment of the present invention.

More specifically, in a semiconductor device 300 shown in FIG. 30, an interlayer dielectric film 50 constituted by a silicon oxide film is provided on an etching stopper film 4 and an interlayer dielectric film 52 having a low dielectric constant including a siloxane bonding in a main structure is provided on the interlayer dielectric film 50. A thickness of the interlayer dielectric film 52 having a low dielectric constant is set to be equivalent to that of an upper wiring to be formed later.

As a result, a high etching selectivity ratio can be obtained by the interlayer dielectric film 52 having a low dielectric constant and the interlayer dielectric film 50. When a trench pattern 10 for burying the upper wiring is to be formed, the etching is stopped at the interlayer dielectric film 50. Consequently, a depth of the trench pattern 10 is defined in self-alignment and an etching time does not need to be managed strictly. Thus, a manufacturing process can be simplified.

<C. Third Embodiment>

While there has been described the example in which silicon nitride, silicon carbide or the like is used as the etching stopper film 4 to be provided on the underlying layer 1 in the method of manufacturing a semiconductor device according to each of the first and second embodiments of the present invention, these have higher dielectric constants than the dielectric constant of silicon oxide and are desirably set to be as thin as possible. Depending on an etching condition of a via hole, a thickness of the film cannot be reduced to have a constant value or less in order to sufficiently fulfill a function of the etching stopper film in some cases.

In those cases, a multilayer etching stopper film is formed in combination with another material having a lower dielectric constant than a dielectric constant of the etching stopper film 4 as in a semiconductor device 400 shown in FIG. 31. Consequently, it is possible to maintain an etching blocking function and a function of a protective film with an effective dielectric constant held to be low.

More specifically, in the semiconductor device 400 shown in FIG. 31, the etching stopper film 4 constituted by silicon carbide may be provided on an underlying layer 1, for example, and an etching stopper film 17 constituted by silicon oxide having a thickness of approximately 50 nm may be provided on the etching stopper film 4 to have a two-layer structure. In FIG. 31, the same structures as those of the semiconductor device 100 shown in FIG. 14 have the same reference numerals and repetitive description will be omitted.

As a matter of course, it is apparent that the above-mentioned structure may be combined with the structure of the semiconductor device 200 shown in FIG. 29 and the structure of the semiconductor device 300 shown in FIG. 30.

While the description has been given by taking, as an example, the case in which a via contact for connecting an upper wiring to a lower wiring is formed in the first to third embodiments, moreover, it is apparent that the present invention can similarly be applied to a contact hole for connecting an impurity layer in a semiconductor substrate to an upper wiring or the like.

<4. Application to Electronic Device>

In the first to third embodiments described above, the description has been given by taking the semiconductor device as an example. The application of the present invention is not restricted to the semiconductor device but it can also be applied to manufacture an electronic device having a multilayer wiring structure and using a chemically amplified resist in formation of a structure to connect wirings, for example, a magnetic head, a laser diode, a photodiode, a sensor or the like.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing an electronic device comprising an underlying layer, an etching stopper film of an insulator provided on said underlying layer, an interlayer dielectric film provided on said etching stopper film, a lower wiring buried in an upper main surface of said underlying layer, an upper wiring buried in an upper main surface of said interlayer dielectric film, and a contact section for electrically connecting said lower wiring to said upper wiring, the method comprising the steps of:

(a) selectively removing said interlayer dielectric film and forming a hole penetrating through said interlayer dielectric film to reach said etching stopper film;

(b) carrying out a heat treatment with said hole opened;

(c) filling said hole with an organic resin which can be cured by a deep ultraviolet light and curing said organic resin with said deep ultraviolet light to form a buried plug;

(d) selectively removing said interlayer dielectric film and said buried plug by using a chemically amplified resist as an etching mask and forming a trench pattern for burying said upper wiring in said upper main surface of said interlayer dielectric film;

(e) removing said busied plug remaining in said hole to obtain a structure in which said trench pattern communicates with said hole;

(f) selectively removing said etching stopper film to expose said lower wiring; and (g) filling said trench pattern and said hole with a conductor material to simultaneously form said upper wiring and said contact section.

2. The method of manufacturing an electronic device according to claim 1, wherein said interlayer dielectric film is a dielectric film containing silicon, oxygen, carbon and hydrogen and having a relative dielectric constant of 3.0 or less including a siloxane bonding as a main structure.

3. The method of manufacturing an electronic device according to claim 2, wherein said interlayer dielectric film is a methylsilsesquioxane film or an SiOC film.

4. The method of manufacturing an electronic device according to claim 1, wherein said electronic device further comprises an upper protective film provided on said upper main surface of said interlayer dielectric film, and said step (a) includes a step of forming said hole to penetrate through said upper protective film.

5. The method of manufacturing an electronic device according to claim 4, further comprising a step of forming an anti-reflection coating over said upper protective film and said buried plug between said steps (c) and (d), said step (d) including a step of selectively removing said anti-reflection coating to form said trench pattern.

6. The method of manufacturing an electronic device according to claim 1, wherein said electronic device further comprises an etching stopper film for forming said trench pattern to define a depth of said trench pattern in said interlayer dielectric film, said step (a) includes a step of forming said hole to penetrate through said etching stopper film for forming said trench pattern, and said step (d) includes a step of setting an etching condition to stop etching at said etching stopper film for forming said trench pattern.

7. The method of manufacturing an electronic device according to claim 1, further comprising a step of carrying out a hydrophobic treatment using a silane coupling material between said steps (b) and (c).

8. The method of manufacturing an electronic device according to claim 1, wherein said interlayer dielectric film has a two-layer structure including a silicon oxide film provided on a lower layer side, and a dielectric film containing silicon, oxygen, carbon and hydrogen and having a relative dielectric constant of 3.0 or less including a siloxane bonding as a main structure which is provided on an upper layer side, and said dielectric film has a thickness which is equivalent to a depth of said trench pattern.

9. The method of manufacturing an electronic device according to claim 1, wherein said etching stopper film has a two-layer structure including a first film provided on a lower layer side, and a second film provided on an upper layer side and having a lower dielectric constant than that of said first film.

10. A method of manufacturing an electronic device comprising an underlying layer, an etching stopper film of an insulator provided on said underlying layer, an interlayer dielectric film provided on said etching stopper film, a lower wiring buried in an upper main surface of said underlying layer, an upper wiring buried in an upper main surface of said interlayer dielectric film, and a contact section for electrically connecting said lower wiring to said upper wiring, the method comprising the steps of:

(a) selectively removing said interlayer dielectric film and forming a hole penetrating through said interlayer dielectric film to reach said etching stopper film;

(b) carrying out a heat treatment with said hole opened;

(c) filling said hole with an SOG material and carrying out a heat treatment at 50 to 200° C. to crosslink said SOG material, thereby forming a buried plug in said hole;

(d) selectively removing said interlayer dielectric film and said buried plug by using a chemically amplified resist as an etching mask and forming a trench pattern for burying said upper wiring in said upper main surface of said interlayer dielectric film;

(e) removing said buried plug remaining in said hole to obtain a structure in which said trench pattern communicates with said hole;

(f) selectively removing said etching stopper film to expose said lower wiring; and (g) filling said trench pattern and said hole with a conductor material to simultaneously form said upper wiring and said contact section.

11. The method of manufacturing an electronic device according to claim 10, wherein said interlayer dielectric film is a dielectric film containing silicon, oxygen, carbon and hydrogen and having a relative dielectric constant of 3.0 or less including a siloxane bonding as a main structure.

12. The method of manufacturing an electronic device according to claim 11, wherein said interlayer dielectric film is a methylsilsesquioxane film or an SiOC film.

13. The method of manufacturing an electronic device according to claim 10, wherein said step (c) includes a step of filling said hole with hydrogen silsesquioxane.

14. The method of manufacturing an electronic device according to claim 13, wherein said step (c) includes a step of carrying out a heat treatment for 10 minutes or less.

15. The method of manufacturing an electronic device according to claim 10, wherein said electronic device further comprises an upper protective film provided on said upper main surface of said interlayer dielectric film, and said step (a) includes a step of forming said hole to penetrate through said upper protective film.

16. The method of manufacturing an electronic device according to claim 15, further comprising a step of forming an anti-reflection coating over said upper protective film and said buried plug between said steps (c) and (d), said step (d) including a step of selectively removing said anti-reflection coating to form said trench pattern.

17. The method of manufacturing an electronic device according to claim 10, wherein said electronic device further comprises an etching stopper film for forming said trench pattern to define a depth of said trench pattern in said interlayer dielectric film, said step (a) includes a step of forming said hole to penetrate through said etching stopper film for forming said trench pattern, and said step (d) includes a step of setting an etching condition to stop etching at said etching stopper film for forming said trench pattern.

18. The method of manufacturing an electronic device according to claim 10, further comprising a step of carrying out a hydrophobic treatment using a silane coupling material between said steps (b) and (c).

19. The method of manufacturing an electronic device according to claim 10, wherein said interlayer dielectric film has a two-layer structure including a silicon oxide film provided on a lower layer side, and a dielectric film containing silicon, oxygen, carbon and hydrogen and having a relative dielectric constant of 3.0 or less including a siloxane bonding as a main structure which is provided on an upper layer side, and said dielectric film has a thickness which is equivalent to a depth of said trench pattern.

20. The method of manufacturing an electronic device according to claim 10, wherein said etching stopper film has a two-layer structure including a first film provided on a lower layer side, and a second film provided on an upper layer side and having a lower dielectric constant than that of said first film.

* * * * *